US010396310B2

(12) United States Patent
Choi et al.

(10) Patent No.: US 10,396,310 B2
(45) Date of Patent: Aug. 27, 2019

(54) DISPLAY APPARATUS

(71) Applicants: Samsung Display Co., Ltd., Yongin-si, Gyeonggi-do (KR); IUCF-HYU (Industry-University Cooperation Foundation Hanyang University), Seoul (KR)

(72) Inventors: Jin-Hwan Choi, Yongin-si (KR); Jin-Seong Park, Seoul (KR); Tae-Woong Kim, Yongin-si (KR); Dong-Won Choi, Seoul (KR)

(73) Assignees: Samsung Display Co., Ltd. (KR); IUCF-HYU (INDUSTRY-UNIVERSITY COOPERATION FOUNDATION HANYANG UNIVERSITY) (KR)

( * ) Notice: Subject to any disclaimer, the term of this patent is extended or adjusted under 35 U.S.C. 154(b) by 0 days.

(21) Appl. No.: 15/889,711

(22) Filed: Feb. 6, 2018

(65) Prior Publication Data

US 2018/0226612 A1   Aug. 9, 2018

(30) Foreign Application Priority Data

Feb. 6, 2017   (KR) .................. 10-2017-0016406

(51) Int. Cl.
*H01L 51/52*   (2006.01)
*H01L 27/32*   (2006.01)

(52) U.S. Cl.
CPC ...... *H01L 51/5253* (2013.01); *H01L 27/3246* (2013.01); *H01L 27/3258* (2013.01); *H01L 27/3276* (2013.01)

(58) Field of Classification Search
None
See application file for complete search history.

(56) References Cited

U.S. PATENT DOCUMENTS

| 9,660,205 | B2* | 5/2017 | George | H01L 51/0097 |
| 9,876,194 | B2* | 1/2018 | Lee | H01L 51/5256 |
| 2009/0179566 | A1* | 7/2009 | Imamura | H05B 33/04 |
| | | | | 313/512 |
| 2012/0098146 | A1 | 4/2012 | Lee | |
| 2012/0201860 | A1* | 8/2012 | Weimer | B01D 67/0002 |
| | | | | 424/400 |
| 2013/0059155 | A1 | 3/2013 | Choi et al. | |
| 2014/0190565 | A1 | 7/2014 | Jung et al. | |
| 2015/0159271 | A1* | 6/2015 | Lee | C23C 16/45529 |
| | | | | 428/213 |
| 2015/0228927 | A1* | 8/2015 | Kim | H01L 51/5203 |
| | | | | 257/40 |

(Continued)

FOREIGN PATENT DOCUMENTS

KR   1020130025168 A   3/2013
KR   1020140064656 A   5/2014

*Primary Examiner* — Walter H Swanson
*Assistant Examiner* — Kien C Ly
(74) *Attorney, Agent, or Firm* — Innovation Counsel LLP

(57) ABSTRACT

A display apparatus includes a display device and an encapsulation layer covering the display device. The encapsulation layer includes a first inorganic encapsulation layer, a second inorganic encapsulation layer, and a hybrid encapsulation layer positioned between the first inorganic encapsulation layer and the second inorganic encapsulation layer. The hybrid encapsulation layer includes at least one of alucone, zircone, zincone, titanicone, and nickelcone.

20 Claims, 5 Drawing Sheets

(56) References Cited

U.S. PATENT DOCUMENTS

| | | | |
|---|---|---|---|
| 2017/0149017 A1* | 5/2017 | Lee | H01L 51/5256 |
| 2017/0250373 A1* | 8/2017 | Kamiya | H01L 51/5256 |
| 2018/0013096 A1* | 1/2018 | Hamada | H01L 51/5256 |
| 2018/0108867 A1* | 4/2018 | Lee | H01L 51/5256 |

\* cited by examiner

DISPLAY APPARATUS

CROSS-REFERENCE TO RELATED APPLICATION

This application claims priority to and the benefit of Korean Patent Application No. 10-2017-0016406, filed on Feb. 6, 2017, in the Korean Intellectual Property Office; the disclosure of the Korean Patent Application is incorporated herein in its entirety by reference.

BACKGROUND

1. Field

The technical field relates to a display apparatus.

2. Description of the Related Art

A display apparatus may include an encapsulation layer for preventing external water or oxygen from damaging components of the display apparatus. In general, material layers constituting the encapsulation layer are manufactured in different chambers using different processes. One or more material layers of the encapsulation layer may be damaged because impure particles may be inserted into the material layer(s) during transportation between the chambers.

SUMMARY

One or more embodiments may be related to a display apparatus including an encapsulation layer having desirable characteristics. The encapsulation layer may prevent or minimize detachment among components of the display apparatus.

According to one or more embodiments, a display apparatus includes the following elements: a substrate having a display area and a peripheral area outside the display area; a first insulating layer arranged on the substrate throughout the display area and the peripheral area; a first dam arranged on the peripheral area to be apart from the first insulating layer; an electrode power supply line arranged on the substrate such that at least a portion of the electrode power supply line is between the first insulating layer and the first dam; a protection conductive layer arranged on the first insulating layer and extending on the electrode power supply line and be electrically connected to the electrode power supply line; a pixel electrode arranged on the first insulating layer in the display area; an opposite electrode arranged on the pixel electrode and extending to the peripheral area to contact the protection conductive layer; and an encapsulation layer arranged on the opposite electrode and a lower surface of which contacts the protection conductive layer in the peripheral area, wherein the encapsulation layer includes a first inorganic encapsulation layer, a hybrid encapsulation layer, and a second inorganic encapsulation layer, which are sequentially stacked in this order, and the hybrid encapsulation layer includes at least one of alucone, zircone, zincone, titanicone, and nickelcone.

Areas of each the first inorganic encapsulation layer and the second inorganic encapsulation layer may be greater than that of the hybrid encapsulation layer, and the first inorganic encapsulation layer and the second inorganic encapsulation layer may contact each other outside the hybrid encapsulation layer.

The hybrid encapsulation layer may be inside the first dam, and the first inorganic encapsulation layer and the second inorganic encapsulation layer may contact each other at an outer side of the first dam.

Each of the first inorganic encapsulation layer and the second inorganic encapsulation layer may include at least one of aluminum oxide, silicon oxide, silicon nitride, silicon oxynitride, titanium dioxide, zirconia, and nickel oxide.

The second inorganic encapsulation layer may include cracks, and the hybrid encapsulation layer may include metal oxide to encapsulate the cracks.

The metal oxide may be the same material as the second inorganic encapsulation layer.

The display apparatus may further include, between the opposite electrode and the encapsulation layer, a capping layer extending outside the opposite electrode to have an end on the first insulating layer.

The first insulating layer may have an opening in the peripheral area and the end of the capping layer may be between an end of the first insulating layer and the opening.

The opening of the first insulating layer may be filled with the protection conductive layer.

An adhesion between the encapsulation layer and the protection conductive layer may be greater than an adhesion between the encapsulation layer and the capping layer.

The display apparatus may further include a protection layer between the capping layer and the encapsulation layer.

The display apparatus may further include a second dam located between the first dam and the first insulating layer and at least a portion of which is on the protection conductive layer.

A height of the first dam from the substrate may be greater than a height of the second dam from the substrate.

One or more embodiments may be related to a display apparatus. The display device may include the following elements: a substrate; a first insulating layer arranged on the substrate; a first dam arranged on the substrate and spaced from the first insulating layer, wherein a trench structure may be positioned between the first dam and the first insulating layer; an electrode power supply line arranged on the substrate, wherein at least a portion of the electrode power supply line may be between the first insulating layer and the first dam in a first direction (e.g., the x direction illustrated in FIG. 2 and FIG. 4), and wherein the first direction may be parallel to a face of the substrate; a protection conductive layer arranged on the first insulating layer and electrically connected to the electrode power supply line; a pixel electrode arranged on the first insulating layer; an opposite electrode overlapping the pixel electrode and directly contacting the protection conductive layer; and an encapsulation layer arranged on the opposite electrode. A first portion of the encapsulation layer may directly contact a first portion of the protection conductive layer and may be positioned between the first insulating layer and the first dam in the first direction. The first portion of the protection conductive layer may be positioned between the electrode power supply line and the first portion of the encapsulation layer in a second direction (e.g., the z direction perpendicular to both the x direction and the y direction illustrated in FIG. 1, FIG. 2, and FIG. 4). The second direction may be perpendicular to the face of the substrate. The encapsulation layer may include a first inorganic encapsulation layer, a second inorganic encapsulation layer, and a hybrid encapsulation layer positioned between the first inorganic encapsulation layer and the second inorganic encapsulation layer. The hybrid encapsulation layer may include at least one of alucone, zircone, zincone, titanicone, and nickelcone.

Each the first inorganic encapsulation layer and the second inorganic encapsulation layer may extend beyond the hybrid encapsulation layer in the first direction. The first inorganic encapsulation layer and the second inorganic encapsulation layer directly contact each other outside the hybrid encapsulation layer.

The hybrid encapsulation layer may be spaced from the first dam. The first dam may be positioned between the first insulating layer and a portion of the first inorganic encapsulation layer in the first direction. The first dam may be positioned between the first insulating layer and a portion of the second inorganic encapsulation layer in the first direction. The portion of the first inorganic encapsulation layer and the portion of the second inorganic encapsulation layer directly contact each other.

Each of the first inorganic encapsulation layer and the second inorganic encapsulation layer may include at least one of aluminum oxide, silicon oxide, silicon nitride, silicon oxynitride, titanium dioxide, zirconia, and nickel oxide.

The second inorganic encapsulation layer has a hole. The hybrid encapsulation layer may include a metal oxide portion. The metal oxide portion may cover the hole.

A material of the metal oxide portion may be identical to a material of the second inorganic encapsulation layer.

The display apparatus may include a capping layer positioned between the opposite electrode and the encapsulation layer. An edge of the capping layer may be positioned between the opposite electrode and a face of the first insulating layer in the first direction. The face of the first insulating layer may be positioned between the edge of the capping layer and the first dam in the first direction.

The first insulating layer may have an opening positioned between the pixel electrode and the face of the first insulating layer in the first direction. The edge of the capping layer may be positioned between the face of the first insulating layer and the opening in the first direction.

The opening of the first insulating layer may be filled with a portion of the protection conductive layer.

An adhesion between the encapsulation layer and the protection conductive layer may be stronger than an adhesion between the encapsulation layer and the capping layer.

The display apparatus may include a protection layer positioned between the capping layer and the encapsulation layer.

The display apparatus may include a second dam located between the first dam and the first insulating layer. A first trench may be positioned between the second dam and the first dam. A second trench may be positioned between the second dam and the first insulating layer. At least a portion of the second dam may be positioned on the protection conductive layer.

A height of the first dam from the substrate may be greater than a height of the second dam from the substrate.

Two opposite faces of the second dam may be positioned between two opposite edges of the electrode power supply line in the first direction.

The second dam may be positioned between two portions of the first inorganic encapsulation layer in the first direction and may directly contact both the two portions of the first inorganic encapsulation layer.

The first portion of the protection conductive layer may directly contact the electrode power supply line and may be positioned between the first insulating layer and the first dam in the first direction.

A portion of the first inorganic encapsulation layer may directly contact the second inorganic encapsulation layer and may be positioned between the first insulating layer and the first dam in the first direction.

The protection conductive layer may directly contact each of the first insulating layer, the electrode power supply line, and a portion of the first dam.

A material of the portion of the first dam may be identical to a material of the first insulating layer.

The display apparatus may include an organic material layer positioned between the pixel electrode and the opposite electrode in the second direction. The second inorganic encapsulation layer may have a hole. Two opposite edges of the hole may be positioned between two opposite edges of the organic material layer in the first direction. The hybrid encapsulation layer may include an oxide portion. The oxide portion may cover the hole. An oxide material of the oxide portion may be identical to an oxide material of the second inorganic encapsulation layer.

DETAILED DESCRIPTION

Figure 1:
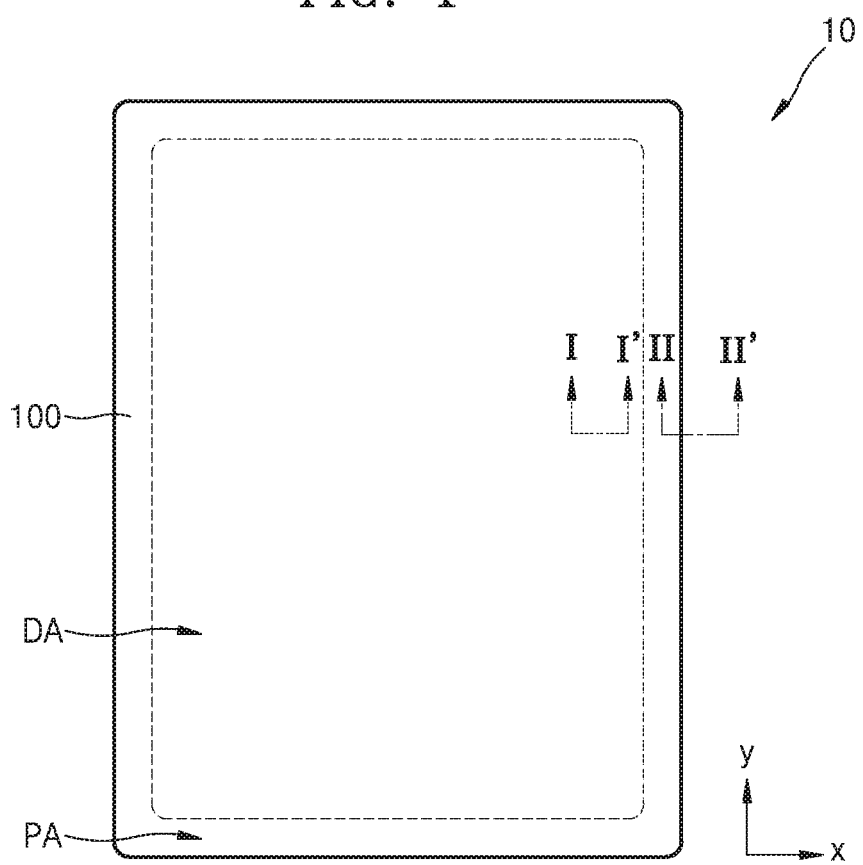
FIG. 1 is a schematic plan view of a portion of a display apparatus according to an embodiment.

Example embodiments are illustrated in the drawings and are described. Practical embodiments encompass all changes, equivalents, and substitutes to the example embodiments.

Although the terms "first," "second," etc. may be used herein to describe various elements, these elements should not be limited by these terms. These terms may be used to distinguish one element from another. Thus, a first element may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-type (or first-set)", "second-type (or second-set)", etc., respectively.

The terminology used herein is for the purpose of describing particular embodiments and is not intended to be limiting of embodiments. As used herein, the singular forms "a," "an," and "the" may include the plural forms as well, unless the context clearly indicates otherwise. In the drawings, sizes of elements may be exaggerated, or elements may be schematically illustrated for convenience and clarity of explanation.

When a first element is referred to as being "on" a second element, the first element can be positioned directly on the second element, or positioned indirectly on the second element with an intervening element positioned between the first element and the second element.

Like reference numerals may refer to like elements. Descriptions may not be unnecessarily repeated. Expressions such as "at least one of," when preceding a list of elements, modify the entire list of elements and may not modify the individual elements of the list.

The term "connect" may mean "electrically connect". The term "insulate" may mean "electrically insulate".

Figure 2:
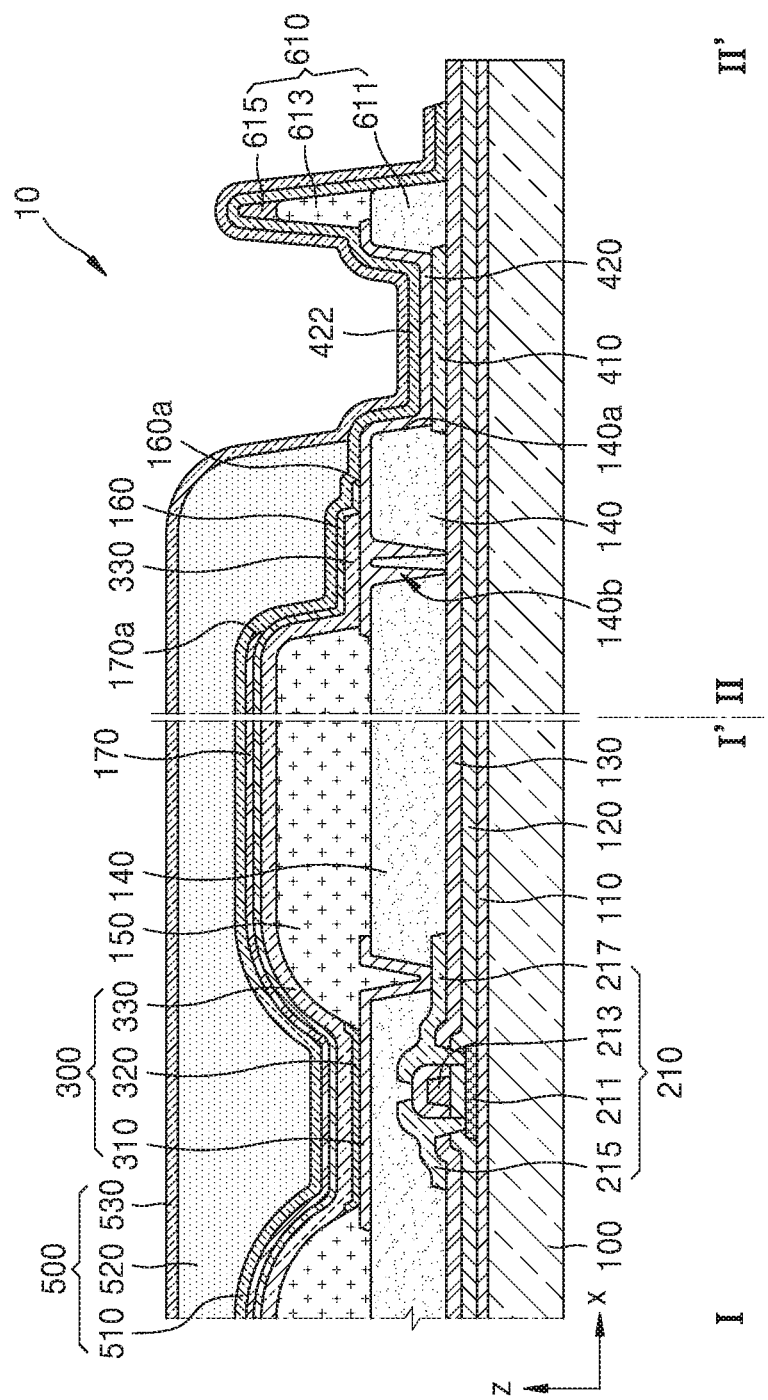
FIG. 2 is a schematic cross-sectional view taken along lines I-I' and II-II' of FIG. 1 according to an embodiment.
Figure 3:
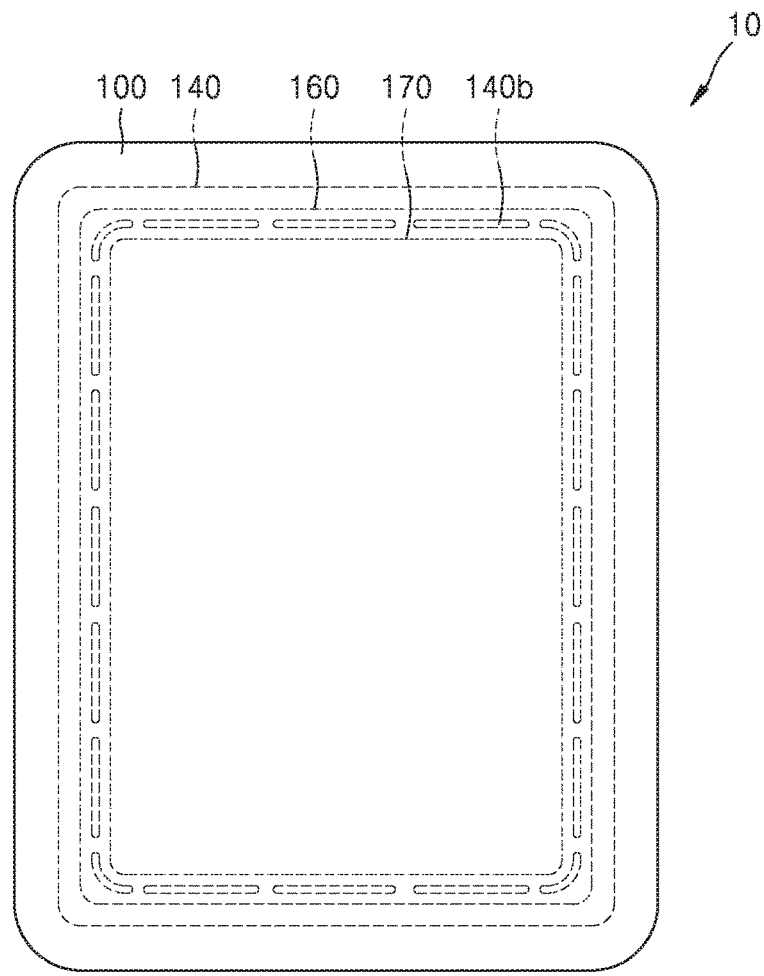
FIG. 3 is a schematic conceptual view of some components of a display apparatus illustrated in FIG. 2 according to an embodiment.
Figure 4:
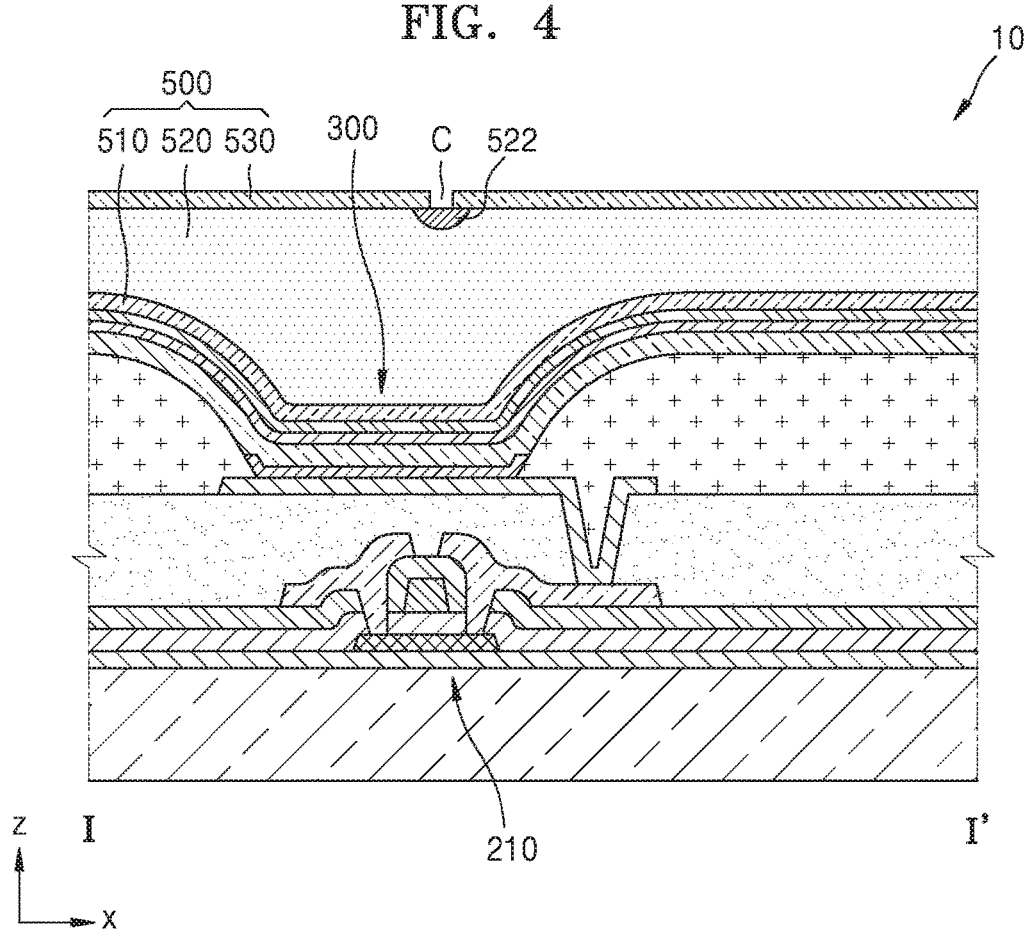
FIG. 4 is a schematic cross-sectional view taken along the line I-I' of FIG. 1 according to an embodiment.

FIG. 1 is a schematic plan view of a portion of a display apparatus 10 according to an embodiment. FIG. 2 is a schematic cross-sectional view taken along lines I-I' and II-II' of FIG. 1 according to an embodiment. FIG. 3 is a schematic conceptual view of some components of the display apparatus 10 illustrated in FIG. 2 according to an embodiment. FIG. 4 is an example schematic cross-sectional view taken along the line I-I' of FIG. 1 according to an embodiment.

Referring to FIGS. 1 through 4, the display apparatus 10 may include various components on a substrate 100. The substrate 100 may have a display area DA and a peripheral area PA outside the display area DA.

The substrate 100 may include one or more of various materials, such as a glass material, a metal material, or a plastic material. The substrate 100 may be a flexible substrate. The substrate 100 may include a polymer resin, such as polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP).

A thin film transistor (TFT) 210 may be arranged in the display area DA of the substrate 100. In addition to the TFT 210, a display device electrically connected to the TFT 210 may be arranged in the display area DA of the substrate 100. In FIG. 2, an organic light-emitting device (OLED) 300 is illustrated as a display device. The display apparatus 10 may include the OLED 300 as the display device. The OLED 300 is electrically connected to the TFT 210. A pixel electrode 310 included in the OLED 300 is electrically connected to the TFT 210. An additional TFT may be arranged in the peripheral area PA of the substrate 100. The TFT in the peripheral area PA may be, for example, a portion of circuitry for controlling electrical signals applied to the display area DA.

The TFT 210 may include a semiconductor layer 211 (including amorphous silicon, polycrystalline silicon, or an organic semiconductor material), a gate electrode 213, a source electrode 215, and a drain electrode 217. In order to planarize a surface of the substrate 100 or prevent impurities from penetrating into the semiconductor layer 211, a buffer layer 110 may be arranged on the substrate 100, and the semiconductor layer 211 may be on the buffer layer 110, the buffer layer 110 including silicon oxide, silicon nitride, silicon oxynitride, or the like.

The gate electrode 213 may be arranged on the semiconductor layer 211. The gate electrode 213 may include a single layer or multiple layers including at least one of Al, Pt, Pd, Ag, Mg, Au, Ni, Nd, Ir, Cr, Li, Ca, Mo, Ti, W, and Cu, by taking into account adhesion with an adjacent layer, surface flatness of a layer on which the gate electrode 213 is stacked, processability, etc. Here, in order to the semiconductor layer 211 from the gate electrode 213, a gate insulating layer 120 may be between the semiconductor layer 211 and the gate electrode 213, the gate insulating layer 120 including silicon oxide, silicon nitride, silicon oxynitride, or the like.

An interlayer insulating layer 130 may be arranged on the gate electrode 213. The interlayer insulating layer 130 may include a single layer or multiple layers formed of silicon oxide, silicon nitride, and/or silicon oxynitride.

The source electrode 215 and the drain electrode 217 may be arranged on the interlayer insulating layer 130. The source electrode 215 and the drain electrode 217 may be electrically connected to the semiconductor layer 211 via contact holes formed in the interlayer insulating layer 130 and the gate insulating layer 120.

Each of the source electrode 215 and the drain electrode 217 may include a single layer or multiple layers formed of at least one of Al, Pt, Pd, Ag, Mg, Au, Ni, Nd, Ir, Cr, Li, Ca, Mo, Ti, W, and Cu, by taking into account conductivity, etc.

A protection layer (not shown) covering the TFT 210 may be arranged to protect the TFT 210. The protection layer may include an inorganic material, such as silicon oxide, silicon nitride, silicon oxynitride, or the like. The protection layer may be a single layer or multiple layers.

A planarization layer 140 may be arranged on the protection layer. For example, when the OLED 300 is arranged on the TFT 210, as illustrated in FIG. 2, the planarization layer 140 may planarize most of the protection layer covering the TFT 210. The planarization layer 140 may include an organic material, such as acryl, benzocyclobutene (BCB), or hexamethyldisiloxane (HMDSO). FIG. 2 illustrates that the planarization layer 140 is a single layer. However, the planarization layer 140 may include multiple layers, and various alterations are possible.

The display apparatus 10 may include both the protection layer and the planarization layer 140, or may include only the planarization layer 140. The planarization layer 140 may be referred to as a first insulating layer.

The OLED 300 may be arranged on the planarization layer 140 in the display area DA of the substrate 100, the OLED 300 including the pixel electrode 310, an opposite electrode 330, and an intermediate layer 320 between the pixel electrode 310 and the opposite electrode 330 and including an emission layer (or light emission layer).

The planarization layer 140 may have an opening exposing at least one of the source electrode 215 and the drain electrode 217 of the TFT 210, and the pixel electrode 310 may be arranged on the planarization layer 140 and be electrically connected to the TFT 210 by contacting the one of the source electrode 215 and the drain electrode 217 via the opening. The pixel electrode 310 may be a (semi) transparent electrode or a reflection electrode. If the pixel electrode 310 is a (semi) transparent electrode, the pixel electrode 310 may include, for example, ITO, IZO, ZnO, $In_2O_3$, IGO, or AZO. If the pixel electrode 310 is a reflection electrode, the pixel electrode 310 may include a reflective layer including Ag, Mg, Al, Pt, Pd, Au, Ni, Nd, Ir, Cr, or an alloy, and/or a layer including ITO, IZO, ZnO, $In_2O_3$, IGO, or AZO. The pixel electrode 310 may include a single layer or multiple layers.

A pixel-defining layer 150 may be arranged on the planarization layer 140. The pixel-defining layer 150 may have openings corresponding to pixels and/or sub-pixels, that is, an opening exposing at least a central portion of the pixel electrode 310, thereby defining a pixel. Also, as illustrated in FIG. 2, the pixel-defining layer 150 may increase a distance between an edge of the pixel electrode 310 and the opposite electrode 330 on the pixel electrode 310, thereby preventing the occurrence of an undesirable arc discharge, etc. at the edge of the pixel electrode 310. The pixel-defining layer 150 may include an organic material, such as PI or HMDSO. The pixel-defining layer 150 may be referred to as a second insulating layer.

The intermediate layer 320 of the OLED 300 may include a small-molecular weight material or a high-molecular weight material. If the intermediate layer 320 includes a small-molecular weight material, the intermediate layer 320 may have a structure in which a hole injection layer (HIL), a hole transport layer (HTL), an emission layer (EML), an electron transport layer (ETL), an electron injection layer (EIL), etc. are stacked, and the intermediate layer 320 may include one or more of various organic materials, such as copper phthalocyanine (CuPc), N,N'-Di(naphthalene-1-yl)-N,N'-diphenyl-benzidine (NPB), tris-8-hydroxyquinoline aluminum (Alq3), etc. The layers including these materials may be formed by vapor deposition.

If the intermediate layer 320 includes a high-molecular weight material, the intermediate layer 320 may have a structure including an HTL and an EML, in general. Here, the HTL may include PEDOT (i.e., a transparent conducting polymer), and the EML may include a polymer material, such as at least one of a poly-phenylenevinylene (PPV)-based material, a polyfluorene-based material, etc. The intermediate layer 320 may be formed by screen printing, inkjet printing, laser induced thermal imaging (LITI), etc.

The intermediate layer 320 may have other structures.

The opposite electrode 330 may be arranged on the display area DA. As illustrated in FIG. 2, the opposite electrode 330 may be arranged to cover the display area DA. The opposite electrode 330 may correspond to a plurality of pixel electrodes 310. The opposite electrode 330 may be a (semi) transparent electrode or a reflection electrode. If the opposite electrode 330 is a (semi) transparent electrode, the opposite electrode 330 may include a layer including a metal having a low work function, such as Li, Ca, LiF/Ca, LiF/Al, Al, Ag, Mg, or a compound thereof, and/or a (semi) transparent conductive layer, such as ITO, IZO, ZnO, or In$_2$O$_3$. If the opposite electrode 330 is a reflection electrode, the opposite electrode 330 may include a layer including Li, Ca, LiF/Ca, LiF/Al, Al, Ag, Mg, or an alloy.

The display device, such as the OLED 300, includes the opposite electrode 330, and in order to display an image, a pre-set electrical signal has to be applied to the opposite electrode 330. An electrode power supply line 410 is in the peripheral area PA to transmit the pre-set electrical signal to the opposite electrode 330.

When one or more conductive layers are formed in the display area DA, the electrode power supply line 410 may be substantially simultaneously formed with the conductive layer(s) using the same material(s) as the conductive layer(s). FIG. 2 illustrates that the electrode power supply line 410 is directly on the interlayer insulating layer 130 in the peripheral area PA, while the source electrode 215 and the drain electrode 217 of the TFT 210 are directly on the interlayer insulating layer 130 in the display area DA. In an embodiment, the electrode power supply line 410, the source electrode 215, and the drain electrode 217 may be formed in one or more same processes using the same material(s). Accordingly, the electrode power supply line 410 may have the same layer structure and/or the same thickness as the source electrode 215 and the drain electrode 217. In an embodiment, the electrode power supply line 410 may be formed on the gate insulating layer 120 simultaneously with the gate electrode 213 using the same material as the gate electrode 213.

The opposite electrode 330 may directly contact the electrode power supply line 410 or may be electrically connected to the electrode power supply line 410 via a protection conductive layer 420 as illustrated in FIG. 2. That is, the protection conductive layer 420 on the planarization layer 140, which may be referred to as the first insulating layer, may extend on the electrode power supply line 410 and be electrically connected to the electrode power supply line 410. Accordingly, the opposite electrode 330 may contact the protection conductive layer 420 in the peripheral area PA, and the protection conductive layer 420 may also contact the electrode power supply line 410 in the peripheral area PA.

The protection conductive layer 420 is on the planarization layer 140, as illustrated in FIG. 2, and thus, the protection conductive layer 420 may be simultaneously formed with components located on the planarization layer 140 in the display area DA using the same material(s) as the components. In detail, when the pixel electrode 310 is formed on the planarization layer 140 in the display area DA, the protection conductive layer 420 may be formed on the planarization layer 140 in the peripheral area PA simultaneously with the pixel electrode 310 using the same material as the pixel electrode 310. Accordingly, the protection conductive layer 420 may have the same layer structure and/or the same thickness as the pixel electrode 310. The protection conductive layer 420 may cover an exposed portion of the electrode power supply line 410, which is not covered by the planarization layer 140, as illustrated in FIG. 2.

The planarization layer 140 may have an opening 140b in the peripheral area PA, as illustrated in FIG. 2. When the protection conductive layer 420 is formed, the protection conductive layer 420 may fill the opening 140b. With this structure, impurities having penetrated into the planarization layer 140 in the peripheral area PA may be effectively prevented from penetrating into the planarization layer 140 in the display area DA.

The opening 140b of the planarization layer 140 may have one or more of various shapes. For example, FIG. 3 illustrates that the planarization layer 140 has a plurality of openings 140b spaced from each other along an outer edge of the display area DA. In an embodiment, an opening 140b of the planarization layer 140 may continually surround the display area DA along the outer edge of the display area DA. In an embodiment, a plurality of openings 140b of the planarization layer 140 may continually surround the display area DA; a first opening may surround the display area DA; a second opening may surround the first opening.

A capping layer 160 for increasing an efficiency of light generated by the OLED 300 may be on the opposite electrode 330. The capping layer 160 may cover the opposite electrode 330, and may extend beyond the opposite electrode 330 so that an end 160a of the capping layer 160 is on the planarization layer 140, which may be referred to as the first insulating layer. In detail, the end 160a of the capping layer 160 is between the opening 140b of the planarization layer 140 and an end 140a of the planarization layer 140. That is, the capping layer 160 may contact the protection conductive layer 420 (below the opposite electrode 330) outside the opposite electrode 330. The opposite electrode 330 may cover the display area DA and extend outside the display area DA. The capping layer 160 may also cover the display area DA and extend to the peripheral area PA outside the display area DA. The capping layer 160 may include an organic material.

An encapsulation layer 500 may be on the capping layer 160. The encapsulation layer 500 may protect the OLED 300 from external water or/and oxygen. To this end, the encapsulation layer 500 may extend not only to the display area DA on which the OLED 300 is located, but also to the peripheral area PA outside the display area DA. The encapsulation layer 500 may have a multi-layered structure, as illustrated in FIG. 2. For example, the encapsulation layer 500 may include a first inorganic encapsulation layer 510, a hybrid encapsulation layer 520, and a second inorganic encapsulation layer 530. In an embodiment, the encapsulation layer 500 may include a plurality of inorganic encapsulation layers and a plurality of hybrid encapsulation layers which are alternately stacked.

The first inorganic encapsulation layer 510 may cover the capping layer 160, and may include at least one of aluminum oxide, silicon oxide, silicon nitride, silicon oxynitride, titanium dioxide, zirconia, and nickel oxide. The first inorganic encapsulation layer 510 may be formed along a structure below the first inorganic encapsulation layer 510.

The hybrid encapsulation layer 520 may be on the first inorganic encapsulation layer 510. The hybrid encapsulation layer 520 may include metalcone (i.e., metal-based organic-inorganic hybrid polymer/material) formed by a metal precursor and organic alcohol reacting with each other. For example, the hybrid encapsulation layer 520 may include at least one of alucone (i.e., aluminum-based organic-inorganic hybrid polymer/material), zircone (i.e., zirconium-based organic-inorganic hybrid polymer/material), zincone (i.e., zinc-based organic-inorganic hybrid polymer/material), titanicone (i.e., titanium-based organic-inorganic hybrid polymer/material), and nickelcone (i.e., nickel-based organic-inorganic hybrid polymer/material).

The second inorganic encapsulation layer 530 may cover the hybrid encapsulation layer 520 and may include at least one of silicon oxide, silicon nitride, silicon oxynitride, titanium dioxide, zirconia, and nickel oxide.

The f inorganic encapsulation layers 510 and 530 and the hybrid encapsulation layer 520 may be formed using the same metal precursor. For example, if the first inorganic encapsulation layer 510 and the second inorganic encapsulation layer 530 are formed using aluminum oxide and if the hybrid encapsulation layer 520 is formed by using alucone, both the inorganic encapsulation layers 510 and 530 and the hybrid encapsulation layer 520 may use trimethylaluminum as a source material.

The inorganic encapsulation layers 510 and 530 and the hybrid encapsulation layer 520 may be sequentially formed in the same chamber. The inorganic encapsulation layers 510 and 530 may be formed by atomic layer deposition (ALD) using trimethylaluminum as the source material and using $H_2O$ or oxygen as a reactant, and the hybrid encapsulation layer 520 may be formed by molecular layer deposition (MLD) using trimethylaluminum as the source material and using ethylene glycol or diethylene glycol as the reactant. That is, by continually supplying trimethylaluminum as the source material and sequentially changing the reactant, the first inorganic encapsulation layer 510, the hybrid encapsulation layer 520, and the second inorganic encapsulation layer 530 may be sequentially formed in the same chamber. Thus, since transportation between the chambers is not necessary to form the inorganic encapsulation layers 510 and 530 and the hybrid encapsulation layer 520, a manufacturing efficiency of the encapsulation layer 500 may increase, and as potential penetration of impure particles into the encapsulation layer 500 during the transportation between the chambers is prevented, damage to the encapsulation layer 500 due to the impure particles may be prevented.

A composition of an interface between the first inorganic encapsulation layer 510 and the hybrid encapsulation layer 520 may change, a composition of an interface between the hybrid encapsulation layer 520 and the second inorganic encapsulation layer 530 may change, and the hybrid encapsulation layer 520 has better water-penetration-preventing characteristics than an organic layer. Advantageously, mechanical stability and the water-penetration-preventing performance of the encapsulation layer 500 may be satisfactory.

An area of the first inorganic encapsulation layer 510 and an area of the second inorganic encapsulation layer 530 may each be greater than an area of the hybrid encapsulation layer 520 in a plan view of the display apparatus 10. The first inorganic encapsulation layer 510 and the second inorganic encapsulation layer 530 may contact each other outside the hybrid encapsulation layer 520. That is, the hybrid encapsulation layer 520 may not be substantially sealed inside the first inorganic encapsulation layer 510 and the second inorganic encapsulation layer 530. Thus, the hybrid encapsulation layer 520 including metalcone having high reactivity with water may be substantially prevented from being changed to metal oxide (potentially caused by reacting with external water).

The encapsulation layer 500 includes the first inorganic encapsulation layer 510, the hybrid encapsulation layer 520, and the second inorganic encapsulation layer 530 as described above. Thus, even if cracks occur in the encapsulation layer 500, the cracks may not penetrate all three of the first inorganic encapsulation layer 510, the hybrid encapsulation layer 520, and the second inorganic encapsulation layer 530. Accordingly, possibility that external water or oxygen penetrates into the display area DA may be prevented or minimized.

In an embodiment, the second inorganic encapsulation layer 530 has cracks C (or holes C), as illustrated in FIG. 4, and the hybrid encapsulation layer 520 may include metal oxide 522 (or metal oxide portions 522) to encapsulate/cover/seal the cracks C. In an embodiment, when/after the cracks C occur in the second inorganic encapsulation layer 530, portions of the hybrid encapsulation layer 520 exposed to external water through the cracks C may react with the water and change to the metal oxide 522, which may seal the cracks C and prevent water or oxygen from penetrating into the display apparatus 10 via the cracks C. The material of the metal oxide 522 may be identical to a material included in the second inorganic encapsulation layer 530. For example, the second inorganic encapsulation layer 530 may be formed of aluminum oxide, the hybrid encapsulation layer 520 may include alucone, and the alucone may react with the water penetrating via the cracks C to form aluminum oxide to seal the cracks C. Thus, even if the cracks C occur in the second inorganic encapsulation layer 530, external water or oxygen may be prevented from penetrating into the OLED 300 or the TFT 210 in the display apparatus 10. The encapsulation layer 500 may be understood to have a self-curing property.

When the encapsulation layer 500 is formed, structures below the encapsulation layer 500 may be potentially damaged. For example, if the first inorganic encapsulation layer 510 is formed directly on the capping layer 160, the capping layer 160 may be damaged, and the optical efficiency of the display apparatus 10 may be affected. Thus, in order to prevent the capping layer 160 from being damaged when the encapsulation layer 500 is formed, a protection layer 170 may be provided between the capping layer 160 and the encapsulation layer 500. The protection layer 170 may include LiF.

As described above, the capping layer 160 may extend not only to the display area DA, but also to the peripheral area PA outside the display area DA, and the protection layer 170 may also extend not only to the display area DA, but also to the peripheral area PA outside the display area DA in order to prevent damage to the capping layer 160 at least in the display area DA. Even if a portion of the capping layer 160 is damaged in the peripheral area PA outside the display area DA, since the display device is not arranged in the peripheral area PA, image quality recognized by a user may not be significantly affected. As illustrated in FIGS. 2 and 3, while at least the protection layer 170 may extend outside the display area DA, an end 170a of the layer 170 may be closer to the display area DA than to the end 160a of the capping layer 160. The protection layer 170 may be formed to completely cover the capping layer 160 so that the end 170a of the protection layer 170 is further from the display area DA than the end 160a of the capping layer 160.

When the hybrid encapsulation layer 520 is formed, it is necessary to limit the location of the hybrid encapsulation layer 520 within a pre-set area, in order to prevent the hybrid encapsulation layer 520 from being exposed to the outside. To this end, a first dam 610 may be provided in the peripheral area PA, as illustrated in FIG. 2. The buffer layer 110, the gate insulating layer 120, the interlayer insulating layer 130, and the planarization layer 140 may be arranged not only in the display area DA, but also in the peripheral area PA of the substrate 100, as illustrated in FIG. 2. The first dam 610 may be provided in the peripheral area PA and spaced from the planarization layer 140.

The first dam 610 may have a multi-layered structure. For example, the first dam 610 may include a first layer 611, a second layer 613, and a third layer 615 overlapping each other and overlapping the substrate 100. The first layer 611 may be formed simultaneously with the planarization layer 140 using the same material as the planarization layer 140. The second layer 613 may be formed simultaneously with the pixel-defining layer 150 using the same material as the pixel-defining layer 150. The third layer 615 may be formed on the second layer 613 using, for example, the same material as the second layer 613.

The first dam 610 may support one or more masks that are used when the intermediate layer 320, the opposite electrode 330, the capping layer 160, and/or the protection layer 170 is formed in a process of manufacturing the display apparatus 10, and may prevent the components formed before the intermediate layer 320 from contacting the masks and being damaged. The first dam 610 may limit the location of the hybrid encapsulation layer 520 within a pre-set area.

The first inorganic encapsulation layer 510 and the second inorganic encapsulation layer 530 of the encapsulation layer 500 may be formed to cover the first dam 610 and extend to an outer side of the first dam 610, as illustrated in FIG. 2. The first inorganic encapsulation layer 510 may contact the interlayer insulating layer 130 at the outer side of the first dam 610. The first inorganic encapsulation layer 510 and the interlayer insulating layer 130 each include an inorganic material, and thus the first inorganic encapsulation layer 510 and the interlayer insulating layer 130 may have excellent/strong adhesion. A lowermost surface of the encapsulation layer 500 may contact the protection conductive layer 420 between the end 160a of the capping layer 160 and the first dam 610. That is, a portion 422 of the first inorganic encapsulation layer 510, which is the lowermost layer of the encapsulation layer 500, directly contacts the protection conductive layer 420 (including the same material as the pixel electrode 310), and thus adhesion between the encapsulation layer 500 and a layer below the encapsulation layer 500 may remain excellent/strong. If the end 160a of the capping layer 160 including an organic material extends to the first dam 610 beyond the end 140a of the planarization layer 140, the encapsulation layer 500 may contact a layer including an organic material at an inner side of the first dam 610, and as a result, adhesion between the encapsulation layer 500 and the layer below the encapsulation layer 500 may decrease. In the display apparatus 10, adhesion between the encapsulation layer 500 and the layer below the encapsulation layer 500 remains high not only at the outer side of the first dam 610, but also between the end 160a of the capping layer 160 and the first dam 610, and thus the encapsulation layer 500 may be effectively prevented from being detached from the layer below the encapsulation layer 500, or potential detachment may be minimized.

Figure 5:
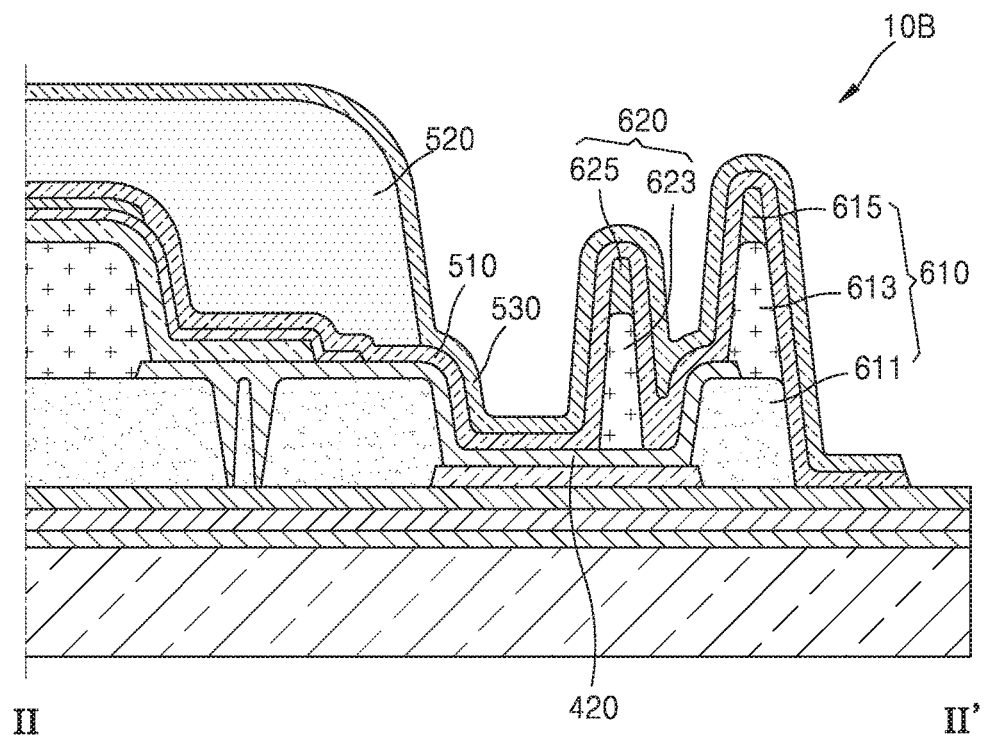
FIG. 5 is a schematic cross-sectional view taken along the line II-II' of FIG. 1 according to an embodiment.

FIG. 5 is a schematic cross-sectional view taken along the line II-II' of FIG. 1 according to an embodiment.

A display apparatus 10B of FIG. 5 differs from the display apparatus 10 according to FIGS. 1 through 4 in that the display apparatus 10B further includes a second dam 620. The second dam 620 may be spaced from the planarization layer 140 and at the inner side of the first dam 610. The second dam 620 may be positioned on the protection conductive layer 420, which is positioned on the electrode power supply line 410.

As described above, the first dam 610 may include the first layer 611, the second layer 613, and the third layer 615. The second dam 620 may include a lower layer 623 (which may be simultaneously formed with the second layer 613 of the first dam 610 using the same material as the second layer 613 of the first dam 610) and may include an upper layer 625 (which may be simultaneously formed with the third layer 615 of the first dam 610 by using the same material as the third layer 615 of the first dam 610). Since the second dam 620 has no layer corresponding to the layer 611, the height of the second dam 620 may be less than the first dam 610. Heights of the first dam 610 and the second dam 620 may denote heights from the substrate (100 of FIG. 1).

The second dam 620 may limit the location of the hybrid encapsulation layer 520 within a pre-set area, and even if the hybrid encapsulation layer 520 is partially formed at an outer side of the second dam 620, the location of the hybrid encapsulation layer 520 may be limited by the first dam 610. The first inorganic encapsulation layer 510 and the second inorganic encapsulation layer 530 may cover the first dam 610 and may directly contact each other for encapsulating the hybrid encapsulation layer 520. The first inorganic encapsulation layer 510 may directly contact the interlayer insulating layer 130 (including an inorganic material) at the outer side of the first dam 610, in order to strengthen interlayer bonding and/or to effectively prevent penetration of external water, etc.

As described above, according to the one or more of embodiments, mechanical stability and the water-penetration-preventing performance of the encapsulation layer may be satisfactory.

Embodiments described herein should be considered in a descriptive sense only and not for purposes of limitation. Descriptions of features or aspects within each embodiment should typically be considered as available for other similar features or aspects in other embodiments.

While embodiments have been described with reference to the figures, various changes in form and details may be made therein without departing from the spirit and scope defined by the following claims.

What is claimed is:
1. A display apparatus comprising:
a substrate;
a first insulating layer arranged on the substrate and includes an opening;
a second insulating layer positioned between the first insulating layer and the substrate;

a first dam arranged on the substrate and spaced from the first insulating layer;

an electrode power supply line arranged on the substrate, wherein at least a portion of the electrode power supply line is between the first insulating layer and the first dam in a first direction, wherein the first direction is parallel to a face of the substrate;

a protection conductive layer arranged on the first insulating layer and electrically connected to the electrode power supply line, wherein a portion of the protection conductive layer is positioned inside the opening and directly contacts the second insulating layer;

a pixel electrode arranged on the first insulating layer;

an opposite electrode overlapping the pixel electrode and directly contacting the protection conductive layer; and an encapsulation layer arranged on the opposite electrode, wherein a first portion of the encapsulation layer directly contacts a first portion of the protection conductive layer and is positioned between the first insulating layer and the first dam in the first direction, wherein the first portion of the protection conductive layer is positioned between the electrode power supply line and the first portion of the encapsulation layer in a second direction, wherein the second direction is perpendicular to the face of the substrate, and wherein the encapsulation layer comprises a first inorganic encapsulation layer, a second inorganic encapsulation layer, and a hybrid encapsulation layer positioned between the first inorganic encapsulation layer and the second inorganic encapsulation layer.

2. The display apparatus of claim 1, wherein the hybrid encapsulation layer comprises at least one of alucone, zircone, zincone, titanicone, and nickelcone, wherein each the first inorganic encapsulation layer and the second inorganic encapsulation layer extends beyond the hybrid encapsulation layer in the first direction, and wherein the first inorganic encapsulation layer and the second inorganic encapsulation layer directly contact each other outside the hybrid encapsulation layer.

3. The display apparatus of claim 1, wherein the hybrid encapsulation layer is inside the first dam, wherein the first dam is positioned between the first insulating layer and a portion of the first inorganic encapsulation layer in the first direction, wherein the first dam is positioned between the first insulating layer and a portion of the second inorganic encapsulation layer in the first direction, and wherein the portion of the first inorganic encapsulation layer and the portion of the second inorganic encapsulation layer directly contact each other.

4. The display apparatus of claim 1, wherein each of the first inorganic encapsulation layer and the second inorganic encapsulation layer comprises at least one of aluminum oxide, silicon oxide, silicon nitride, silicon oxynitride, titanium dioxide, zirconia, and nickel oxide.

5. The display apparatus of claim 1,
wherein the second inorganic encapsulation layer has a through hole, wherein the hybrid encapsulation layer comprises a metal oxide portion, and wherein the metal oxide portion covers the through hole.

6. The display apparatus of claim 5, wherein a material of the metal oxide portion is identical to a material of the second inorganic encapsulation layer.

7. The display apparatus of claim 1,
further comprising a capping layer positioned between the opposite electrode and the encapsulation layer, wherein an edge of the capping layer is positioned between the opposite electrode and a face of the first insulating layer in the first direction, and wherein the face of the first insulating layer is positioned between the edge of the capping layer and the first dam in the first direction.

8. The display apparatus of claim 7, wherein the first insulating layer has an opening positioned between the pixel electrode and the face of the first insulating layer in the first direction, and wherein the edge of the capping layer is positioned between the face of the first insulating layer and the opening in the first direction.

9. The display apparatus of claim 8, wherein the opening of the first insulating layer is filled with a portion of the protection conductive layer.

10. The display apparatus of claim 7, wherein an adhesion between the encapsulation layer and the protection conductive layer is stronger than an adhesion between the encapsulation layer and the capping layer.

11. The display apparatus of claim 7, further comprising a protection layer positioned between the capping layer and the encapsulation layer.

12. The display apparatus of claim 1, further comprising a second dam located between the first dam and the first insulating layer, wherein a first trench is positioned between the second dam and the first dam, wherein a second trench is positioned between the second dam and the first insulating layer, and wherein at least a portion of the second dam is positioned on the protection conductive layer.

13. The display apparatus of claim 12, wherein a height of the first dam from the substrate is greater than a height of the second dam from the substrate.

14. The display apparatus of claim 12, wherein two opposite faces of the second dam are positioned between two opposite edges of the electrode power supply line in the first direction.

15. The display apparatus of claim 12, wherein the second dam is positioned between two portions of the first inorganic encapsulation layer in the first direction and directly contacts both the two portions of the first inorganic encapsulation layer.

16. The display apparatus of claim 1, wherein the first portion of the protection conductive layer directly contacts the electrode power supply line and is positioned between the first insulating layer and the first dam in the first direction.

17. The display apparatus of claim 1, wherein a portion of the first inorganic encapsulation layer directly contacts the second inorganic encapsulation layer and is positioned between the first insulating layer and the first dam in the first direction.

18. The display apparatus of claim 1, wherein the protection conductive layer directly contacts each of the first insulating layer, the electrode power supply line, and a portion of the first dam.

19. The display apparatus of claim 18, wherein a material of the portion of the first dam is identical to a material of the first insulating layer.

20. The display apparatus of claim 1, further comprising an organic material layer positioned between the pixel electrode and the opposite electrode in the second direction, wherein the second inorganic encapsulation layer has a hole, wherein the hybrid encapsulation layer comprises an oxide portion, wherein the oxide portion covers the hole, and wherein an oxide material of the oxide portion is identical to an oxide material of the second inorganic encapsulation layer.

* * * * *